(12) United States Patent
Kohlscheen

(10) Patent No.: US 11,724,317 B1
(45) Date of Patent: Aug. 15, 2023

(54) CUBIC PHASE REFRACTORY COATINGS AND APPLICATIONS THEREOF

(71) Applicant: KENNAMETAL INC., Latrobe, PA (US)

(72) Inventor: Joern Kohlscheen, Ebermannstadt (DE)

(73) Assignee: KENNAMETAL INC., Latrobe, PA (US)

( * ) Notice: Subject to any disclaimer, the term of this patent is extended or adjusted under 35 U.S.C. 154(b) by 0 days.

(21) Appl. No.: 17/691,546

(22) Filed: Mar. 10, 2022

(51) Int. Cl.
*B23B 27/14* (2006.01)
*C23C 30/00* (2006.01)
*C23C 14/06* (2006.01)

(52) U.S. Cl.
CPC ........ *B23B 27/148* (2013.01); *C23C 14/0617* (2013.01); *C23C 30/005* (2013.01); *B23B 2224/08* (2013.01); *B23B 2224/24* (2013.01); *B23B 2226/125* (2013.01); *B23B 2226/315* (2013.01)

(58) Field of Classification Search
CPC .............. B23B 27/148; B23B 2224/24; B23B 2226/125; B23B 2226/315; C23C 14/0617; C23C 30/005
USPC ....................................................... 428/698
See application file for complete search history.

(56) References Cited

U.S. PATENT DOCUMENTS

| 9,416,440 B2 | 8/2016 | Hultman et al. |
| 2014/0234616 A1* | 8/2014 | Hultman ............. C23C 14/0641 204/192.15 |

FOREIGN PATENT DOCUMENTS

WO   WO2019048507 A1   3/2019

OTHER PUBLICATIONS

Greczynski, G. et al, "Role of Tin+ and Aln+ ion irradiation (n=1, 2) during Ti Al N alloy film growth in a hybrid HIPIMS/magnetron mode", Elsevier, Surface & Coatings Technology, 206, 2012, pp. 4202-4211.
Raman et al., "Magnetic field influence on ionization zones in high-power impulse Magnetron Sputtering", Elsevier, Vacuum 156, 2018, pp. 9-19.
Huo, C., "Modeling High Power Impulse Magnetron Sputtering Discharges", Licentiate Thesis, KTH Electrical Engineering, Royal Institute of Technology, Sweden 2012.

* cited by examiner

*Primary Examiner* — Humera N. Sheikh
*Assistant Examiner* — Katherine A Christy
(74) *Attorney, Agent, or Firm* — Larry R. Meenan

(57) ABSTRACT

In one aspect, refractory coatings are described herein having multiple cubic phases. In some embodiments, a coating comprises a refractory layer of TiAlN deposited by PVD adhered to the substrate, the refractory layer comprising a cubic TiAlN phase and a cubic AlN phase, wherein a ratio of intensity in the X-ray diffractogram (XRD) of a (200) reflection of the cubic AlN phase to intensity of a (200) reflection of the cubic TiAlN phase, I(200)/I(200), is at least 0.5.

15 Claims, 3 Drawing Sheets

CUBIC PHASE REFRACTORY COATINGS AND APPLICATIONS THEREOF

FIELD

The present invention relates to hard refractory coatings for cutting tools and, in particular, to refractory coatings deposited by physical vapor deposition exhibiting cubic phases.

BACKGROUND

One or more layers of refractory material are often applied to cutting tool surfaces by physical vapor deposition (PVD) techniques to improve properties including wear resistance, performance and lifetime of the cutting tool. Titanium nitride (TiN) coatings, for example, are commonly applied by PVD to cemented carbide cutting tool substrates. However, TiN begins oxidation at about 500° C. forming rutile $TiO_2$, thereby promoting rapid coating deterioration. Incorporation of aluminum into the cubic lattice can slow degradative oxidation of a TiN coating by forming a protective aluminum-rich oxide film at the coating surface.

While providing enhancement to high temperature stability, aluminum can also induce structural changes in a TiN coating having a negative impact on coating performance. Increasing amounts of aluminum incorporated into a TiN coating can induce growth of hexagonal close packed (hcp) aluminum nitride (AlN) phase, altering the crystalline structure of the coating from single phase cubic to a mixture of cubic and hexagonal phases. Aluminum content in excess of 70 atomic percent can further alter the crystalline structure of the AlTiN layer to single phase hcp. Significant amounts of hexagonal phase leads to a considerable reduction in hardness of AlTiN, resulting in premature coating failure or other undesirable performance characteristics. The inability to sufficiently control hexagonal phase formation has obstructed full realization of the advantages offered by aluminum additions to TiN coatings.

SUMMARY

In one aspect, the foregoing disadvantages are addressed by refractory coatings described herein having multiple cubic phases. In some embodiments, a coating comprises a refractory layer of TiAlN deposited by physical vapor deposition (PVD), the refractory layer comprising a cubic TiAlN phase and a cubic AlN phase, wherein a ratio of intensity in the X-ray diffractogram (XRD) of a (200) reflection of the cubic AlN phase to intensity of a (200) reflection of the cubic TiAlN phase, I(200)/I(200), is at least 0.5. In some embodiments, the I(200)/I(200) ratio is at least one.

In another aspect, a coating comprises a refractory layer of MAlN deposited by PVD, the refractory layer comprising a cubic AlN phase, wherein M is selected from the group consisting to titanium, chromium, vanadium, and zirconium. Coatings described herein can be adhered to various substrates including, but not limited to, tools such as cutting tools. These and other embodiments are described in greater detail in the detailed description which follows.

DETAILED DESCRIPTION

Figure 1:
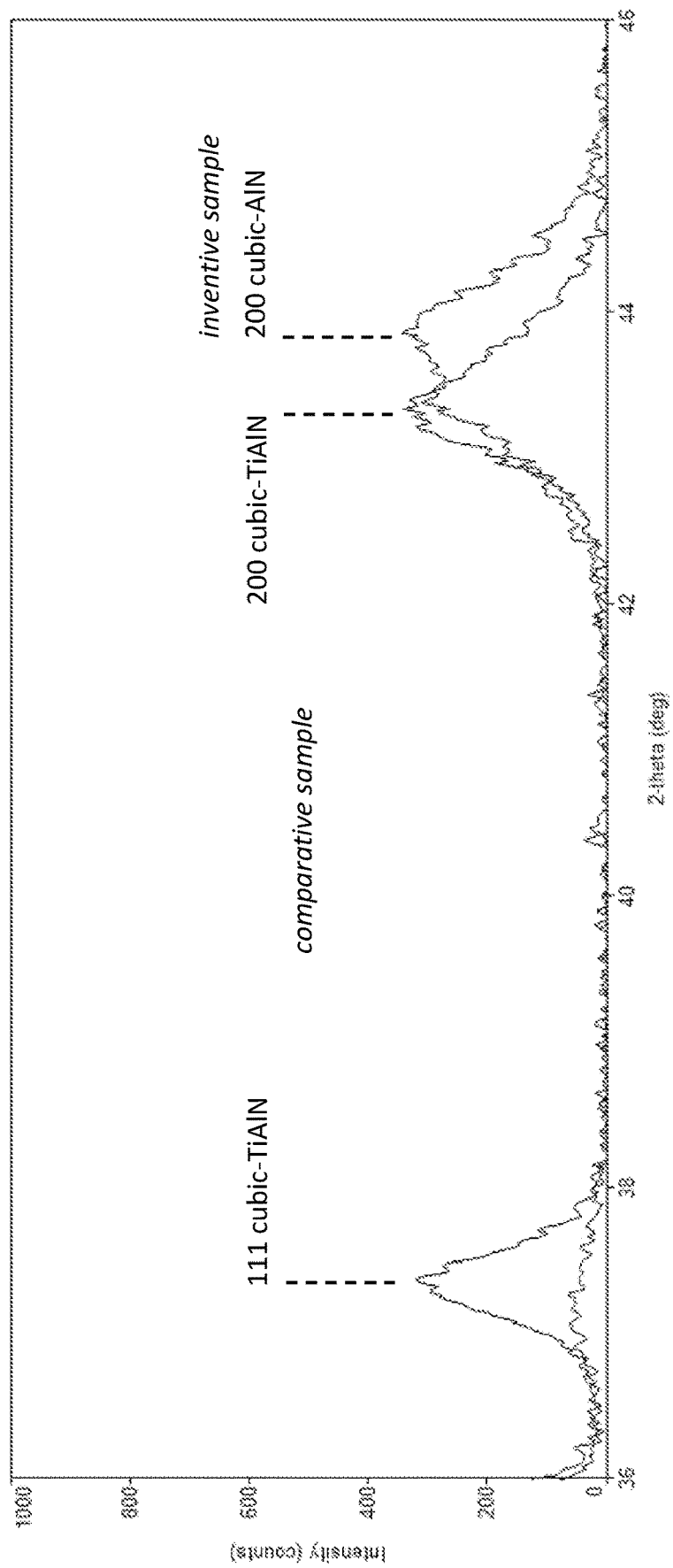
FIG. 1 is an X-ray diffractogram of a TiAlN refractory layer comprising cubic AlN phase and cubic TiAlN phase relative to a comparative sample TiAlN refractory layer, according to one embodiment.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Coatings and Coated Tools

Coatings described herein can be applied or adhered to various substrates including, but not limited to, cutting tools. In some embodiments, a coated tool comprises a substrate, and a coating comprising a refractory layer of TiAlN deposited by PVD adhered to the substrate, the refractory layer comprising a cubic TiAlN phase and a cubic AlN phase, wherein a ratio of intensity in the XRD of a (200) reflection of the cubic AlN phase to intensity of a (200) reflection of the cubic TiAlN phase, I(200)/I(200), is at least 0.5. In some embodiments, the I(200)/I(200) ratio is 0.5-5 or 1-5.

In another aspect, a coating comprises a refractory layer of MAlN deposited by PVD, the refractory layer comprising a cubic AlN phase, wherein M is selected from the group consisting to titanium, chromium, vanadium, and zirconium.

Turning now to specific components, the coated tool, in some embodiments, is a cutting tool. A coated cutting tool can comprise any substrate not inconsistent with the objectives of the present invention. A substrate, in some embodiments, is an end mill, drill or indexable cutting insert. Indexable cutting inserts, in some embodiments, can have any desired ANSI standard geometry for milling or turning applications. Alternatively, cutting inserts are not indexable and/or do fall under a specific ANSI designation. Substrates of coated cutting tools described herein can be formed of cemented carbide, carbide, ceramic, cermet or steel. A cemented carbide substrate, in some embodiments, comprises tungsten carbide (WC). WC can be present in a cutting tool substrate in an amount of at least about 80 weight percent or in an amount of at least about 85 weight percent. Additionally, metallic binder of cemented carbide can comprise cobalt or cobalt alloy. Cobalt, for example, can be present in a cemented carbide substrate in an amount ranging from 3 weight percent to 15 weight percent. In some embodiments, cobalt is present in a cemented carbide substrate in an amount ranging from 5-12 weight percent or from 6-10 weight percent. Further, a cemented carbide substrate may exhibit a zone of binder enrichment beginning at and extending inwardly from the surface of the substrate.

Cemented carbide cutting tool substrates can also comprise one or more additives such as, for example, one or more of the following elements and/or their compounds: titanium, niobium, vanadium, tantalum, chromium, zirconium and/or hafnium. In some embodiments, titanium, niobium, vanadium, tantalum, chromium, zirconium and/or hafnium form solid solution carbides with WC of the substrate. In such embodiments, the substrate can comprise one or more solid solution carbides in an amount ranging from 0.1-5 weight percent. Additionally, a cemented carbide substrate can comprise nitrogen.

In some embodiments, coatings described herein comprise a refractory layer of MAlN deposited by PVD, wherein M is selected from titanium, chromium, vanadium, and zirconium. In some embodiments, the MAlN is of the formula $M_{1-x}Al_xN$ where $x \geq 0.5$. In some embodiments, x of a $M_{1-x}Al_xN$ refractory layer ranges from 0.6 to 0.9. Additionally, x of a $M_{1-x}Al_xN$ refractory layer described herein has a value selected from Table I.

TABLE I

| Al Content of $M_{1-x}Al_xN$ (at. %) Value of x in $M_{1-x}Al_xN$ |
|---|
| ≥0.55 |
| ≥0.6 |
| ≥0.64 |
| ≥0.68 |
| ≥0.69 |
| ≥0.7 |
| ≥0.75 |
| 0.6-0.85 |
| 0.65-0.8 |
| 0.7-0.8 |
| 0.7-0.85 |

The cubic AlN phase, in some embodiments, is exhibited by the MAlN refractory layer irrespective of whether M is titanium, chromium, vanadium, or zirconium. Composition of the MAN refractory layer can be determined by any suitable technique established in the art, including X-ray fluorescence (XRF).

As described herein, a ratio of XRD intensity of an I(200) reflection of the cubic AlN phase to intensity of an I(200) reflection of the cubic TiAlN phase, I(200)/I(200), is at least 0.5 or at least 1. In some embodiments, I(200)/I(200) has a value selected from Table II.

TABLE II

| I(200)/I(200) Value |
|---|
| ≥0.7 |
| ≥0.8 |
| 0.7-5 |
| 0.8-5 |
| 1-5 |
| 1-3 |
| 1-2 |
| 0.5-1.5 |
| 1-1.5 |

The XRD peak data for calculating the I(200)/I(200) ratio was measured on X-ray diffractometer having the following specifications:

Rigaku MF600

Bragg Brentano geometry

Cu Kalpha tube, voltage 45 kV, current 15 mA

Ni kbeta filter in front of detector incident slit=10×2 mm receiving slit=0.3 mm Na I (sodium iodide crystal) scintillation detector with Be window Data Analysis, including use of a profile function to precisely identify peak position and height, was performed according to the following specifications:

Background substraction: Linear

Peak profile fitting: Origin Software

Lorentzian function:

$$y = y_0 + \frac{2A}{\pi} \frac{w}{4(x - x_c)^2 + w^2}$$

wherein:

x=diffraction angle (2θ)

y=signal intensity $y_0$=intensity baseline (background)

w=full width half max (FWHM)

$x_c$=peak center (maximum intensity)

A=area under curve (baseline $y_0$)

The refractory layer of MAlN comprising cubic AlN phase described herein, in some embodiments, has hardness of at least 25 GPa. Hardness values are determined according to ISO 14577 with a Vickers indenter at an indentation depth of 0.25 μm. In some embodiments, a refractory layer having a construction described herein, including an x value selected from Table I and cubic AlN phase from Table II has hardness according to Table III.

TABLE III

| Refractory Layer Hardness (GPa) |
|---|
| ≥25 |
| ≥27 |
| ≥28 |
| 25-35 |
| 25-30 |
| 26-32 |
| 27-35 |
| 28-35 |
| 30-40 |

In addition to hardness, the refractory layer of MAlN, including a TiAlN layer, can have any thickness not inconsistent with the objectives of the present invention. The refractory layer, for example, can have a thickness of 1 μm to 10 μm or 2 μm to 8 μm. In some embodiments, a refractory layer comprising MAlN has a thickness greater than 5 μm. For example, a refractory layer having a construction described herein, including an x value selected from Table I, I(200)/I(200) ratio selected from Table II and/or hardness selected from to Table III, can have a thickness selected from Table IV.

TABLE IV

| Refractory Layer Thickness (μm) |
|---|
| 1-3 |
| 1-5 |
| ≥5 |
| ≥6 |
| ≥7 |
| ≥8 |
| ≥9 |
| ≥10 |

TABLE IV-continued

| Refractory Layer Thickness (μm) |
| --- |
| 6-30 |
| 8-20 |
| 9-15 |

Refractory layer thicknesses described herein were measured on a flank surface of the cutting tool.

Refractory layers described herein comprising cubic AlN, in some embodiments, are operable to have thickness values selected from Table IV while demonstrating residual compressive stress less than 2.5 GPa. In some embodiments, for example, the refractory layer comprising $M_{1-x}Al_xN$ can have a residual compressive stress according to Table V.

TABLE V

| Refractory Layer Residual Compressive Stress |
| --- |
| ≤2.2 |
| ≤2.0 |
| ≤1.5 |
| ≤1.0 |
| 0.5 to 2.5 |
| 0.8 to 2.0 |
| 1.0 to 1.5 |

Inclusion of cubic AlN in the refractory layer can reduce residual compressive stress relative to refractory layers where cubic AlN is absent. In some embodiments, inclusion of cubic AlN in a MAN refractory layer, such as TiAlN, can reduce residual compressive stress by at least 50 percent relative to a refractory layer of identical composition or substantially identical composition where cubic AlN is absent. In some embodiments, such reduction in residual compressive stress can be 60-80 percent.

In the absence of a specific designation as being compressive, residual stress values described herein can be assigned a negative value to indicate the residual stress is compressive. As is understood by one of skill in the art, residual stress, in the absence of a specific designation, is assigned positive values to indicate tensile stress and negative values to indicate compressive stress.

For refractory layers comprising $M_{1-x}Al_xN$ described herein, a modified $Sin^2\psi$ method was used employing Seemann-Bohlin (S-B) focusing geometry for determining residual stress and shear stress. See V. Valvoda, R. Kuzel, R. Cerny, D. S. Rafaja, J. Musil, C.Kadlec, A. J. Perry, *Thin Solid Films* 193/194 (1990) 401. According to this method, interplanar spacing of all measurable diffraction peaks with different Miller (hkl) indices was determined using the grazing-incidence X-ray diffraction geometry. [Diffraction peaks of different (hkl) planes were collected in a single 2θ scan with a fixed incident-beam angle to the specimen.] Since diffraction planes produce different angles to the sample surface normal in the approach of Perry et al., sample tilting ψ is not necessary. Perry et al. provided that the angle ψ actually corresponds to the Bragg angle θ minus the grazing angle γ(ψ=θ−γ). Therefore, in a single 2θ scan, a range of ψ angles is automatically selected when a number of Bragg peaks with different Miller indices are measured at different 2θ angles. The residual stress was then derived from a plot of the lattice parameters calculated from different peaks vs. $Sin^2\psi$.

For refractory layers comprising MAlN wherein M is titanium, for example, residual stress and shear stress was determined by x-ray diffraction using the grazing incidence $Sin^2\psi$ method with reference to multiple (hkl) reflections of the AlTiN crystalline phase. The instrument used for residual stress determination is the same as that described above for determining (200) and (111) intensities.

The (111), (200), (220), (311), (222), (331), (420), and (422) reflections of AlTiN were selected for the measurement of the residual stress levels. The grazing incidence angle was selected to minimize the substrate reflections while insuring that entire refractory layer thickness is included in the analysis. Data collection parameters for step size and count time were adjusted for each (hkl) reflection to obtain adequate peak intensity for accurate determination of peak position.

Peak data was then corrected for Absorption and Transparency using the following equations:

Absorption Correction $$A = \left[1 - \frac{\tan(\omega - \theta)}{\tan\theta}\right] \times \left[1 - e^{(-\upsilon t \times \frac{2\sin\theta \times \cos(\omega-\theta)}{\sin^2\theta - \sin^2(\omega-\theta)})}\right]$$

Transparency Correction $$\Delta 2\theta = \frac{180}{\pi} \times \frac{2\tau}{R} \times \frac{\sin(\theta)\cos(\theta)}{\sin(\omega)}$$

$$\text{with } \tau = \frac{t}{\beta} \times \frac{(1-\beta) \times e^{-\beta} - e^{-\beta}}{1 - e^{-\beta}}$$

$$\text{and } \beta = \frac{2\mu t \sin\theta \times \cos(\omega - \theta)}{\sin^2\theta - \sin^2(\omega - \theta)}$$

where:
t=thickness of layer
μ=linear absorption coefficient ($cm^{-1}$)
θ=2Theta/2(degrees)
(ω−θ)=omega offset angle (degrees)
ψ=tilt angle (Psi stress) (degrees)
τ=information depth (microns)
R=Radius of goniometers (mm)

The peak data was corrected for Lorentz polarization using the following equation:

Polarization Correction $$LP = \frac{\cos^2 2\theta_{mon} \times \cos^2 2\theta}{\sin\theta}$$

$2\theta_{mon}$ = diffraction angle of graphite monochromator

The $K\alpha_2$ peaks were removed using the Ladell model. Peak positions were refined using a modified Lorentzian shape profile function.

The refractory layer residual stress was calculated from the general equation:

$$\frac{d_{\varphi\psi} - d_0}{d_0} = S_1(\sigma_1 + \sigma_2) + \frac{1}{2}S_2\sigma_\varphi \sin^2\psi$$

where $\sigma_\varphi = \sigma_1 \cos^2 \varphi + \sigma_2 \sin^2 \varphi$
$d_{\varphi\psi}$=lattice constant at angle $\varphi$ and tilt $\psi$
$d_o$=strain free lattice constant
$\varphi$=rotation angle
$\psi$=specimen tilt
$\sigma_1$ & $\sigma_2$=primary stress tensors in specimen surface
$\sigma_\varphi$=stress at $\varphi$ rotation angle
$S_1$ & ½ $S_2$=X-ray elastic constants $$S_1 = \frac{-\upsilon}{E} \quad \frac{1}{2}S_2 = \frac{1+\upsilon}{E}$$

For the present AlTiN analysis Poisson's Ratio ($\upsilon$) was set to 0.20, and the elastic modulus (E in GPa) was determined from nano-indentation analysis conducted with a Fischerscope HM2000 in accordance with ISO standard 14577 using a Vickers indenter. Indentation depth was set to 0.25 μm. Residual stress analysis by XRD can be performed in a similar manner on refractory layers comprising $Cr_{1-x}Al_xN$ and/or $Zr_{1-x}Al_xN$ by selection of multiple (hkl) reflections appropriate for these compositions, as known to one of skill in the art. Further, Poisson's Ratio ($\upsilon$) and elastic moduli (E) for layers of $Cr_{1-x}Al_xN$ and/or $Zr_{1-x}Al_xN$ can also be determined by nano-indentation analysis as described herein.

Additionally, in some embodiments, the refractory layer of MAlN has an average grain size less than 50 nm. The average grain size, for example, can ranges from 1-20 nm or 5-15 nm, in some embodiments.

These and other embodiments are further illustrated in the following non-limiting examples.

Example 1 Coated Cutting Tool

Cutting inserts were coated with a refractory layer of TiAlN comprising cubic AlN according to the following protocol. Cemented carbide (WC-6Co) cutting inserts of geometry HNGJ0905ANSN-GD were placed in a Cemecon CC800® HIPIMS PVD apparatus employing an AlTi cathode and Al cathode. Deposition conditions of the refractory layer of TiAlN comprising cubic AlN are provided in Table VI.

TABLE VI

| TiAlN PVD Conditions | |
| --- | --- |
| Temperature (° C.) | 400 |
| HIPIMS Frequency (Hz) | 2000 |
| Pulse Length | 100 μs |
| Power AlTi Cathode | 8 kW |
| Power Al Cathode | 0.8 kW |
| Substrate bias (V) | 180 V |
| Pressure | 0.2 Pa |
| Ar/N$_2$ flow ratio | 3:1 |

The TiAlN refractory layer had a composition of $Ti_{0.26}Al_{0.74}N$ and exhibited cubic AlN phase with a (200) reflection at 43.98° 2(θ). The cubic TiAlN (200) reflection was 43.35° 2(θ). The TiAlN refractory layer also had a thickness of 3.4 μm and hardness of 35 GPa. The ratio of intensity in the X-ray diffractogram (XRD) of a (200) reflection of the cubic AlN phase to intensity of a (200) reflection of the cubic TiAlN phase, I(200)/I(200), was 0.64.

Comparative cutting inserts of the same geometry were placed in a Cemecon CC80® sputter PVD apparatus and provided a TiAlN refractory layer as set forth in Table VII.

TABLE VII

| Comparative TiAlN PVD Conditions | |
| --- | --- |
| Temperature (° C.) | 600 |
| HIPIMS Frequency (Hz) | n/a |
| Pulse Length | n/a |
| Power AlTi Cathode | 7.5 kW |
| Power Al Cathode | n/a |
| Substrate bias (V) | 100 V |
| Pressure | 0.6 Pa |
| Ar/N$_2$ flow ratio | 3.5:1 |

The TiAlN refractory layer had a composition of $Ti_{0.46}Al_{0.54}N$ and did not exhibit cubic AlN phase. The TiAlN refractory layer also had a thickness of 3.2 μm and hardness of 29 GPa.

Figure 2:
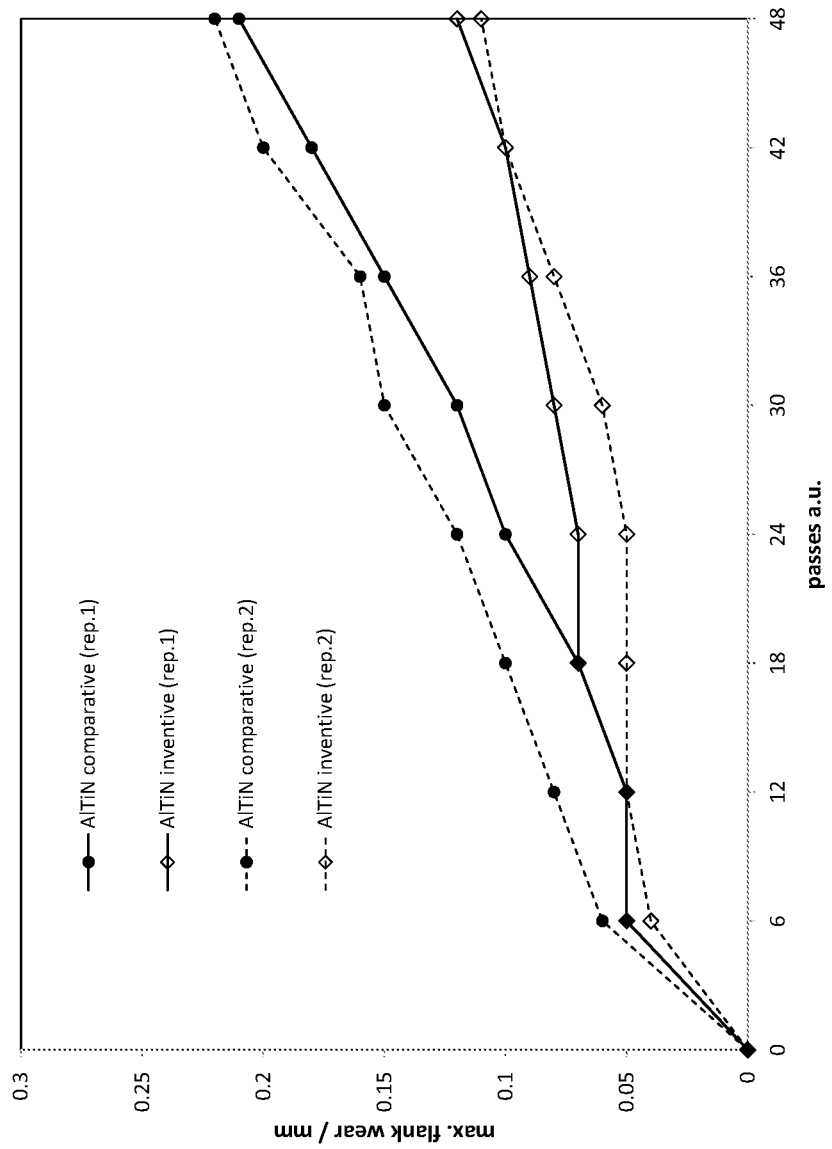
FIG. 2 illustrates metal cutting testing results of inserts described herein comprising a TiAlN refractory layer comprising cubic AlN phase relative to comparative PVD coated cutting inserts lacking a cubic AlN phase, according to some embodiments.

Cutting inserts described herein having cubic AlN phase and the comparative cutting inserts were subjected to metal cutting testing. The testing parameters were:
Workpiece: EN-GJS-600(ductile cast iron, UTS=600 MPa)
vc: 220 m/min
fz: 0.2 mm/rev
ap: 2 mm
ae: 28 mm
Coolant: air
Maximum flank wear values (mm) were recorded for the inventive and comparative cutting inserts over two repetitions (rep1 and rep2). The results are illustrated in FIG. 2. As provided in FIG. 2, the cutting inserts comprising the TiAlN refractory layer having cubic AlN demonstrated significantly less flank wear relative to the comparative cutting inserts.

Example 2 Coated Cutting Tool

Cutting inserts were coated with a refractory layer of TiAlN comprising cubic AlN according to the following protocol. Cemented carbide (WC-6Co) cutting inserts of geometry HNGJ0905ANSN-GD were placed in a Cemecon CC800® HIPIMS PVD apparatus employing an AlTi cathode and Al cathode. Deposition conditions of the refractory layer of TiAlN comprising cubic AlN are provided in Table VIII.

TABLE VIII

| TiAlN PVD Conditions | |
| --- | --- |
| Temperature (° C.) | 400 |
| HIPIMS Frequency (Hz) | 2000 |
| Pulse Length | 100 μs |
| Power AlTi Cathode | 8 kW |
| Power Al Cathode | 0.8 kW |
| Substrate bias (V) | 180 V |
| Pressure | 0.2 Pa |
| Ar/N$_2$ flow ratio | 3:1 |

The TiAlN refractory layer had a composition of $Ti_{0.31}Al_{0.69}N$ and exhibited cubic AlN phase with a (200) reflection at 44.11° 2(θ). The cubic TiAlN (200) reflection was 43.33° 2(θ). The TiAlN refractory layer also had a thickness of 3.4 μm and hardness of 33 GPa. The ratio of intensity in the X-ray diffractogram (XRD) of a (200) reflection of the cubic AlN phase to intensity of a (200) reflection of the cubic TiAlN phase, I(200)/I(200), was 1.42.

Comparative cutting inserts of the same geometry were placed in the Cemecon CC800® HIPIMS PVD apparatus employing an AlTi cathode and provided a TiAlN refractory layer as set forth in Table IX.

TABLE IX

| Comparative TiAlN PVD Conditions | |
| --- | --- |
| Temperature (° C.) | 600 |
| HIPIMS Frequency (Hz) | 4000 |
| Pulse Length | 70 μs |
| Power AlTi Cathode | 10 kW |
| Power Al Cathode | 0 kW |
| Substrate bias (V) | 60 V |
| Pressure | 0.6 Pa |
| Ar/N$_2$ flow ratio | 3.5:1 |

The TiAlN refractory layer had a composition of Ti$_{0.42}$Al$_{0.58}$N and did not exhibit cubic AlN phase. The TiAlN refractory layer also had a thickness of 3.5 μm and hardness of 31 GPa.

Cutting inserts described herein having cubic AlN phase and the comparative cutting inserts were subjected to metal cutting testing. The testing parameters were:

Workpiece: EN-GJS-600(ductile cast iron, UTS=600 MPa)

vc: 220 m/min fz: 0.2 mm/rev ap: 2 mm ae: 28 mm

Coolant: air

Figure 3:
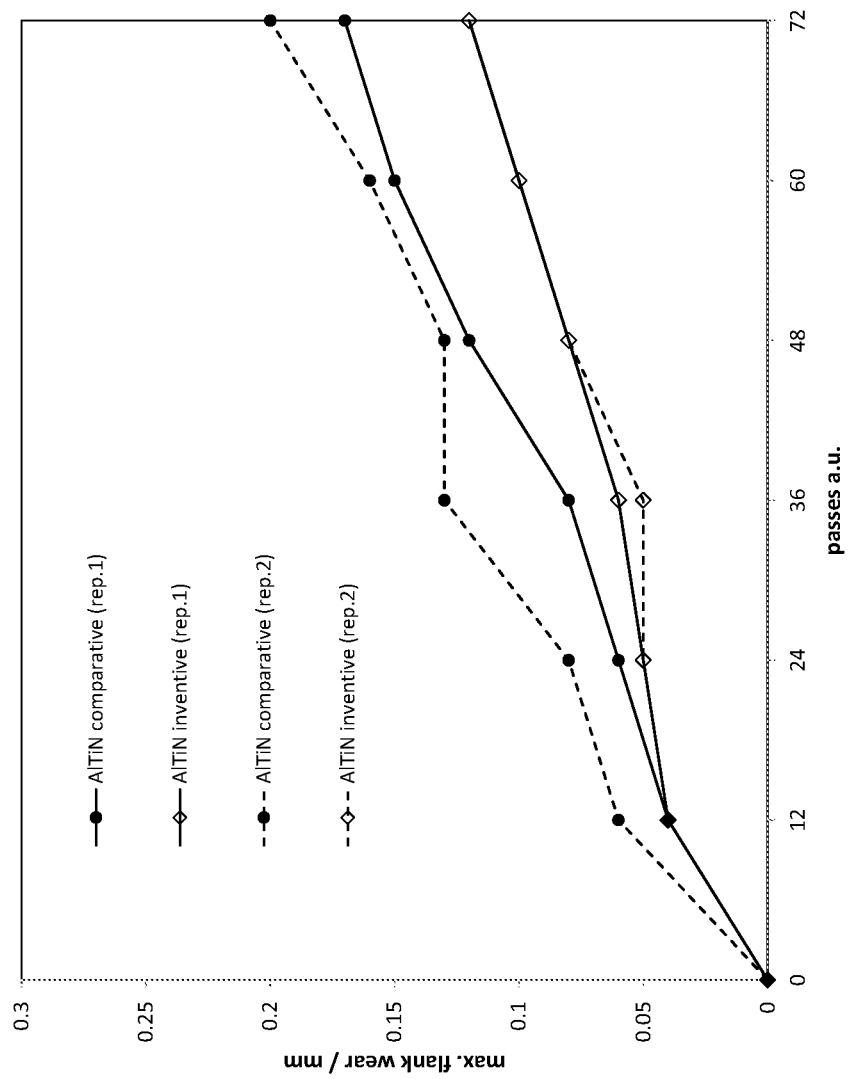
FIG. 3 illustrates metal cutting testing results of inserts described herein comprising a TiAlN refractory layer comprising cubic AlN phase relative to comparative PVD coated cutting inserts lacking a cubic AlN phase, according to some embodiments.

Maximum flank wear values (mm) were recorded for the inventive and comparative cutting inserts over two repetitions (rep1 and rep2). The results are illustrated in FIG. 3. As provided in FIG. 2, the cutting inserts comprising the TiAlN refractory layer having cubic AlN demonstrated significantly less flank wear relative to the comparative cutting inserts.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A coated tool comprising:
   a substrate; and
   a coating comprising a refractory layer of TiAlN deposited by physical vapor deposition adhered to the substrate, the refractory layer comprising a cubic TiAlN phase and a cubic AlN phase, wherein a ratio of intensity in an X-ray diffractogram (XRD) of a (200) reflection of the cubic AlN phase to intensity of a (200) reflection of the cubic TiAlN phase, I(200)/I(200), is at least 0.5.

2. The coated tool of claim 1, wherein the MAlN is of the formula M$_{1-x}$Al$_x$N where x≥0.5.

3. The coated tool of claim 2, wherein x≥0.6.

4. The coated tool of claim 2, wherein 0.6≤x≤0.75.

5. The coated tool of claim 1, wherein the I(200)/I(200) is at least 1.

6. The coated tool of claim 1, wherein the I(200)/I(200) is 0.5-5.

7. The coated tool of claim 1, wherein the I(200)/I(200) is 1-2.

8. The coated tool of claim 1, wherein the refractory layer has a thickness of 1-5 μm.

9. The coated tool of claim 1, wherein the refractory layer comprises grains having an average size of 1-20 nm.

10. The coated tool of claim 1, wherein the refractory layer has residual compressive stress less than 2 GPa.

11. The coated tool of claim 1, wherein the refractory layer has residual compressive stress of 0.5-1.5 GPa.

12. The coated tool of claim 1, wherein the coating further comprises a layer in addition to the refractory layer.

13. The coated tool of claim 12, wherein the additional layer comprises one or more metallic elements selected from the group consisting of aluminum and metallic elements of Groups IVB, VB and VIB of the Periodic Table and one or more non-metallic elements selected from the group consisting of non-metallic elements of Groups IIIA, IVA, VA, and VIA of the Periodic Table.

14. The coated tool of claim 1, wherein the substrate is a cutting tool.

15. The coated tool of claim 1, wherein the substrate comprises sintered cemented carbide, cermet, polycrystalline cubic boron nitride, polycrystalline diamond, or combinations thereof.

* * * * *